(12) United States Patent
Goto et al.

(10) Patent No.: US 7,202,176 B1
(45) Date of Patent: Apr. 10, 2007

(54) ENHANCED STRIPPING OF LOW-K FILMS USING DOWNSTREAM GAS MIXING

(75) Inventors: Haruhiro Harry Goto, Saratoga, CA (US); David Cheung, Foster City, CA (US); Prabhat Kumar Sinha, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 156 days.

(21) Appl. No.: 11/011,273

(22) Filed: Dec. 13, 2004

(51) Int. Cl.
*H01L 21/302* (2006.01)
*H01L 21/3065* (2006.01)

(52) U.S. Cl. ............... 438/706; 438/710; 438/712; 438/723; 438/725; 156/345.1

(58) Field of Classification Search ........... 438/706, 438/710, 712, 725; 156/345.1
See application file for complete search history.

(56) References Cited

U.S. PATENT DOCUMENTS

| | | | |
|---|---|---|---|
| 4,357,203 A | 11/1982 | Zelez | |
| 5,660,682 A | 8/1997 | Zhao et al. | |
| 6,204,192 B1 | 3/2001 | Zhao et al. | |
| 6,277,733 B1 | 8/2001 | Smith | |
| 6,281,135 B1 | 8/2001 | Han et al. | |
| 6,306,564 B1* | 10/2001 | Mullee | 430/329 |
| 6,342,446 B1 | 1/2002 | Smith et al. | |
| 6,426,304 B1 | 7/2002 | Chien et al. | |
| 6,465,964 B1* | 10/2002 | Taguchi et al. | 315/111.21 |
| 6,638,875 B2 | 10/2003 | Han et al. | |
| 6,680,164 B2 | 1/2004 | Nguyen et al. | |

OTHER PUBLICATIONS

Kikuchi et al., Native Oxide Removal on Si Surfaces by NF3-Added Hydrogen and Water Vapor Plasma Downstream Treatment, Jpn J. Appl. Phys. vol. 33 (1994), pp. 2207-2211, Part 1, No. 4B, Apr. 1994.
Woody K. Chung, "Downstream Plasma Removal of Mobile Ion Impurity From $SIO_2$", Published Proceedings of the 8th International Plasma Processing Symposium, Fall 1990, 7 pages.
Woody K, Chung, "Low Damage, Downstream RF Plasma Ashing of High Energy, Heavily Doped Implanted Resists," Semicon Korea, Dec. 1989.
A. Kalnitsky and W. K. Chung, "Characterization and Optimization of a Single Wafer Downstream Plasma Stripper," Journal of the Electrochemical Society, vol. 135, No. 9, Sep. 1988, pp. 2338-2341.
Goto, et al., "Photoresist Strip Method for Low-K Dielectrics", Novellus Systems, Inc., U.S. Appl. No. 10/890,653, filed Jul. 13, 2004, pp. 1-29.

* cited by examiner

*Primary Examiner*—Nadine Norton
*Assistant Examiner*—Lynette T. Umez-Eronini
(74) *Attorney, Agent, or Firm*—Beyer Weaver, LLP.

(57) ABSTRACT

The present invention pertains to methods for removing unwanted material from a work piece. More specifically, the invention pertains to stripping photo-resist material and removing etch-related residues from a semiconductor wafer during semiconductor manufacturing. Methods involve implementing a hydrogen plasma operation with downstream mixing with an inert gas. The invention is effective at stripping photo-resist and removing residues from low-k dielectric material used in Damascene devices.

21 Claims, 8 Drawing Sheets

ENHANCED STRIPPING OF LOW-K FILMS USING DOWNSTREAM GAS MIXING

BACKGROUND

The present invention pertains to methods and systems for stripping photo-resist material and removing etch-related residues from The Surface of a Partially Fabricated Integrated circuit in preparation for further processing. More specifically, the invention Pertains to Methods and Systems for Implementing a Plasma Operation that Includes introducing an inert gas downstream of the plasma source. The invention is effective at efficiently stripping photo-resist and removing residues from low-k dielectric layers after etching processes used to produce Damascene devices.

Damascene processing techniques are often preferred methods in modern integrated circuit manufacturing schemes because they require fewer processing steps and offers a higher yield than other methods. Damascene processing involves forming metal conductors on integrated circuits by forming inlaid metal lines in trenches and vias in a dielectric layer (inter-metal dielectric). As part of the Damascene process, a layer of photoresist is deposited on a dielectric layer. The photoresist is a light-sensitive organic polymer which can be "spun on" in liquid form and dries to a solid thin film. The photosensitive photoresist is then patterned using light through the mask and wet solvent. A plasma etching process (dry etch) is then used to etch exposed portions of dielectric and transfer the pattern into the dielectric, forming vias and trenches in the dielectric layer.

Once the dielectric layer is etched, the photoresist must be stripped and any etch-related residues must be thoroughly removed before subsequent processing to avoid embedding impurities in the device. Conventional processes for stripping photoresist employ a plasma formed from a mixture of gases with the presence of oxygen in the plasma. The highly reactive oxygen based plasma reacts with and oxidizes the organic photoresist to form volatile components that are carried away from the wafer surface.

Highly oxidizing conditions are also generally unsuitable for use on low dielectric constant (low-k) materials. Low-k materials have been used as inter-metal and/or inter-layer dielectrics between conductive interconnects employed to reduce the delay in signal propagation due to capacitive effects. The lower the dielectric constant of the dielectric material, the lower the capacitance of the dielectric and the lower the RC delay of the integrated circuit. Typically, low-k dielectrics are silicon-oxide based materials with some amount of incorporated carbon, commonly referred to as carbon doped oxide (CDO). It is believed, although not necessarily proven, that the oxygen scavenges or removes carbon from the low-k materials. In many of these materials such as CDOs, the presence of carbon is instrumental in providing a low dielectric constant. Hence, to the extent that the oxygen removes carbon from these materials, it effectively increases the dielectric constant. As processes used to fabricate integrated circuits move toward smaller and smaller dimensions and requires the use of dielectric materials having lower and lower dielectric constants, it has been found that the conventional strip plasma conditions are not suitable.

Hydrogen plasmas or hydrogen-based plasmas with a weak oxidizing agent are effective at stripping photo-resist and removing residues from low-k dielectric layers without the problems associated with conventional strip plasmas. However, these methods require a high hydrogen flow to achieve an acceptable strip rate. Because high hydrogen flow requires costly abatement and pump systems, it is desirable to have hydrogen flow as low as possible while maintaining an acceptable strip rate. In addition, it is desirable to reduce hydrogen flow due to hydrogen's flammability and the dangers associated with handling and abating it.

Others have reported using hydrogen-based plasmas with inert gases such as hydrogen and helium introduced with hydrogen at the plasma source. Han et al (U.S. Pat. Nos. 6,281,135 and 6,638,875) describe using a mixture of hydrogen, helium and fluorine and Zhao et al (U.S. Pat. Nos. 5,660,682 and 6,204,192) describe using a mixture of hydrogen and argon. However, helium or argon ions in the plasma have harmful effects. Mixtures of hydrogen and helium result in high plasma damage on low-k materials due to the long life of ionized helium plasma. Ionized argon causes unwanted sputtering of the quartz material in the plasma tube (the portion of some reactors where the plasma is formed). Introduction of argon to hydrogen plasmas has also been shown to reduce strip rate.

What is needed therefore are improved and methods and apparatus for stripping photoresist and etch-related materials from dielectric materials, especially from low-k dielectric materials, which reduce the required hydrogen flow rate while maintaining an acceptable strip rate.

SUMMARY OF THE INVENTION

The present invention addresses the aforementioned need by providing improved methods and an apparatus for stripping photoresist and removing etch-related residues from dielectric materials. An inert gas is introduced to the plasma downstream of the plasma source and upstream of a showerhead that directs gas into the reaction chamber. The inert gas mixes with the plasma, reducing the required hydrogen flow rate and improving strip rate and strip rate uniformity.

In one aspect of the invention, methods involve removing material from a work piece in a process chamber according to the following operations: (a) introducing a gas comprising hydrogen into a plasma source, (b) generating a plasma from the gas introduced into the plasma source, (c) introducing an inert gas downstream of the plasma source and upstream of the work piece; and (d) removing the material from the work piece. Another aspect of this invention relates to an apparatus for removing material from a work piece surface comprising: (a) a plasma source, (b) a gas inlet for introducing a hydrogen-based gas into the plasma source, (c) a gas inlet for introducing an inert gas downstream of the plasma source and upstream of the work piece; and (e) a process chamber.

The methods and apparatus of the invention may be used to remove photoresist/etch byproduct materials from dielectric materials on a partially fabricated integrated circuit. In a preferred embodiment, the work piece comprises a single or dual Damascene device.

In preferred embodiments of the invention, the inert gas comprises argon or helium. In a particularly preferred embodiment, the inert gas comprises argon. In preferred embodiments, the inert gas flow rate is between 0.15 and 10.0 times the hydrogen flow rate. In particularly preferred embodiments, the inert gas flow rate is between 0.75 and 6.0 times the hydrogen flow rate.

The inert gas is introduced downstream of the plasma source and upstream of work piece via gas inlets. In a preferred embodiment, the inert gas is introduced upstream of a showerhead that directs the plasma/inert gas mixture into the process chamber.

In preferred embodiments, the gas inlets comprise jets which may be positioned to optimize mixing of the inert gas with the plasma. In preferred embodiments, the jets are positioned such that the inert gas enters at a zero degree angle from the bottom of the plasma source.

In preferred embodiments of the invention, the gas comprising hydrogen introduced into the plasma source further comprises a weak oxidizing agent. In a particularly preferred embodiment, the weak oxidizing agent comprises carbon dioxide.

The plasma source used in accordance with the methods and apparatus of the invention may be any type of plasma source. In a preferred embodiment an RF plasma source is used.

The process chamber used in accordance with the methods and apparatus of the invention may be any suitable process chamber. The process chamber may be one chamber of a multi-chambered apparatus or it may be part of a single chamber apparatus.

These and other features and advantages of the present invention will be described in more detail below with reference to the associated drawings.

DETAILED DESCRIPTION OF THE PREFERRED EMBODIMENTS

Introduction

Figure 1:
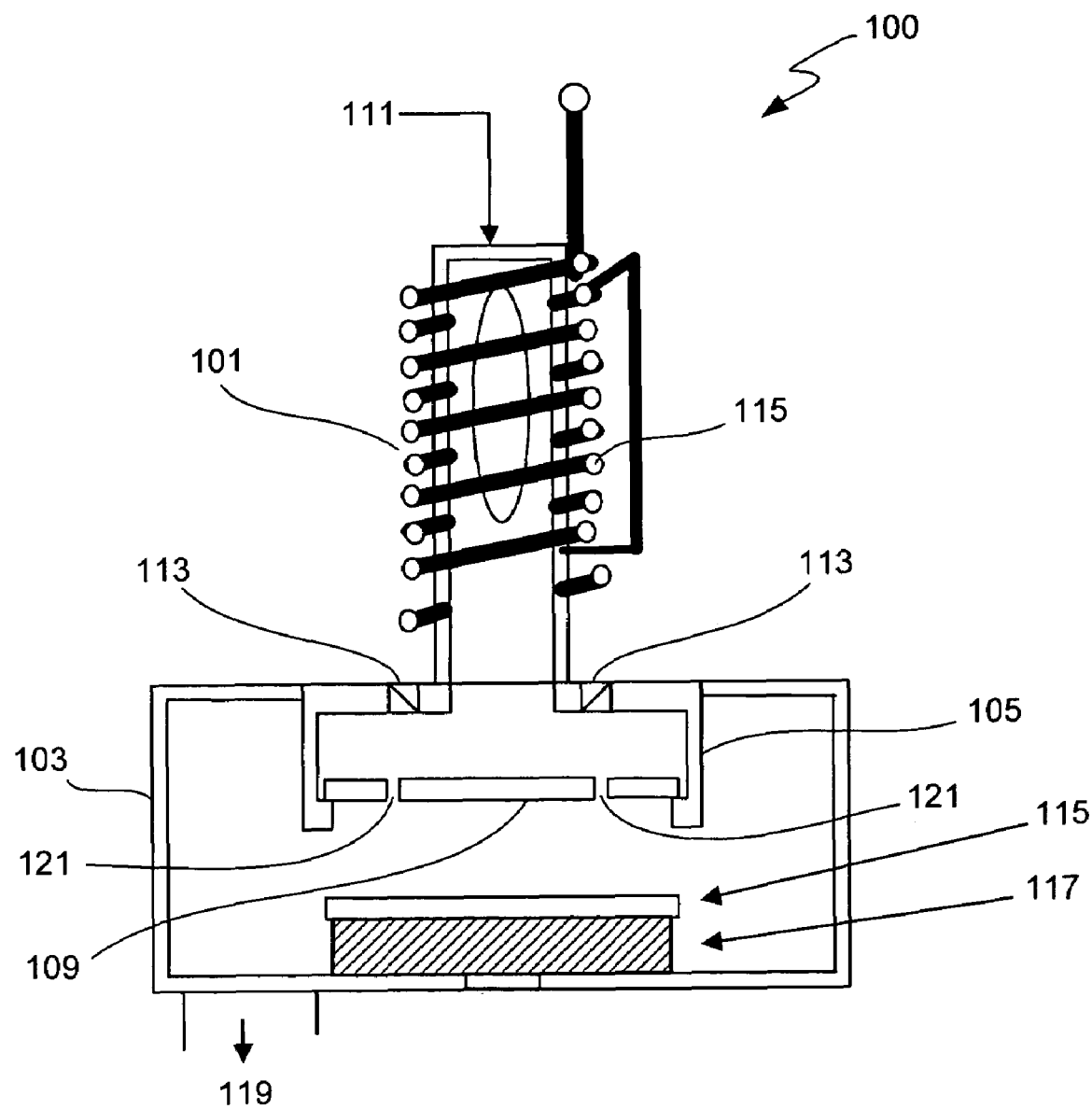
FIG. 1 is a schematic illustration showing an apparatus according to one embodiment of the claimed invention and suitable for practicing the methods of the claimed invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the terms "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

As mentioned previously, the methods and apparatus of the invention may be used to efficiently and effectively to remove materials from a low-k dielectric materials. The invention is not limited to dielectric materials or low-k dielectric materials. The invention is also not limited to any particular category of low-k dielectrics. For instance, described methods and apparatus may be effectively used with dielectrics with k values less than 4.0 ("first generation" low-k dielectrics), dielectrics with k values less than about 2.8 ("second generation" low-k dielectrics) and dielectrics with k values less than about 2.0 ("ultra-low-k" dielectrics). The low-k dielectric may be porous or non-porous (sometimes referred to as a "dense" low-k dielectric). Generally, low-k dense dielectrics are those having k values no greater than 2.8 and low-k porous dielectrics are those having k values no greater than 2.2. Low-k dielectrics of any suitable composition may be used, including silicon oxide based dielectrics doped with fluorine and/or carbon. Non-silicon oxide based dielectrics, such as polymeric materials, may also be used. Any suitable process may be used to deposit the low-k dielectric, including as spin-on deposit and CVD deposit techniques. In the case of forming porous dielectrics, any suitable method may be used. A typical method involves co-depositing a silicon-based backbone and an organic porogen and subsequently removing the porogen component, leaving a porous dielectric film. Other methods include sol-gel techniques. Specific examples of suitable low-k films are carbon based spin-on type films such as SILK™ and CVD deposited porous films such as Coral™.

The methods and apparatus of the invention use plasmas that are produced from gases that contain hydrogen. The gases may also contain a weak oxidizing agent. One skilled in the art will recognize that the actual species present in the plasma may be a mixture of different ions and molecules derived from the hydrogen and/or weak oxidizing agent. It is noted that other species may be present in the reaction chamber, such as small hydrocarbons, carbon dioxide, water vapor and other volatile components as the plasma reacts with and breaks down the organic photoresist and other residues. One of skill in the art will also recognize that reference to the initial gas/gases introduced into the plasma is/are different from other gas/gases that may exist after the plasma is formed.

FIG. 1 is a schematic illustration of an apparatus 100 according to one embodiment of the claimed invention. The apparatus depicted in FIG. 1 is also suitable to practice methods of claimed invention. Apparatus 100 has a plasma source 101 and a process chamber 103 separated by a showerhead assembly 105. Plasma source 101 is connected to gas inlet 111. Showerhead 109 forms the bottom of showerhead assembly 105. Inert gas inlets 113 are downstream of plasma source 101 and upstream of wafer 115 and showerhead 109. Inside process chamber 103, a wafer 115 with photoresist/dry etch byproduct material rests on a platen (or stage) 117. Platen 117 may be fitted with a heating/cooling element. In some embodiments, platen 117 is also configured for applying a bias to wafer 115. Low pressure is attained in reaction chamber 103 via vacuum pump and conduit 119.

In operation, a gas is introduced via gas inlet 111 to the plasma source 101. The gas introduced to the plasma source contains the chemically active species that will be ionized in the plasma source to form a plasma. Gas inlet 111 may be any type of gas inlet and may include multiple ports or jets. Plasma source 101 is where the active species of the gas introduced to the source is generated to form a plasma. In FIG. 1, an RF plasma source is shown with induction coils 115. Induction coils 115 are energized and the plasma is generated. An inert gas is introduced via gas inlets 113 upstream of the showerhead and downstream of the plasma source. The inert gas mixes with the plasma. Gas inlets 113 may be any type of gas inlets and may include multiple ports or jets to optimize mixing the inert gas with the plasma. Showerhead 109 directs the plasma/inert gas mixture into process chamber 103 through showerhead holes 121. There may be any number and arrangement of showerhead holes 121 to maximize uniformity of the plasma/gas mixture in process chamber 103. Showerhead assembly 105, which has an applied voltage, terminates the flow of some ions and allows the flow of neutral species into process chamber 103. As mentioned, wafer 115 may be temperature controlled and/or a RF bias may be applied. The plasma/inert gas mixture removes the photoresist/etch byproduct material from the wafer.

In some embodiments of the claimed invention, the apparatus does not include showerhead assembly 105 and showerhead 109. In these embodiments, the inert gas inlets 113 introduce the inert gas directly into the process chamber where it mixes with the plasma upstream of wafer 115.

Figure 2:
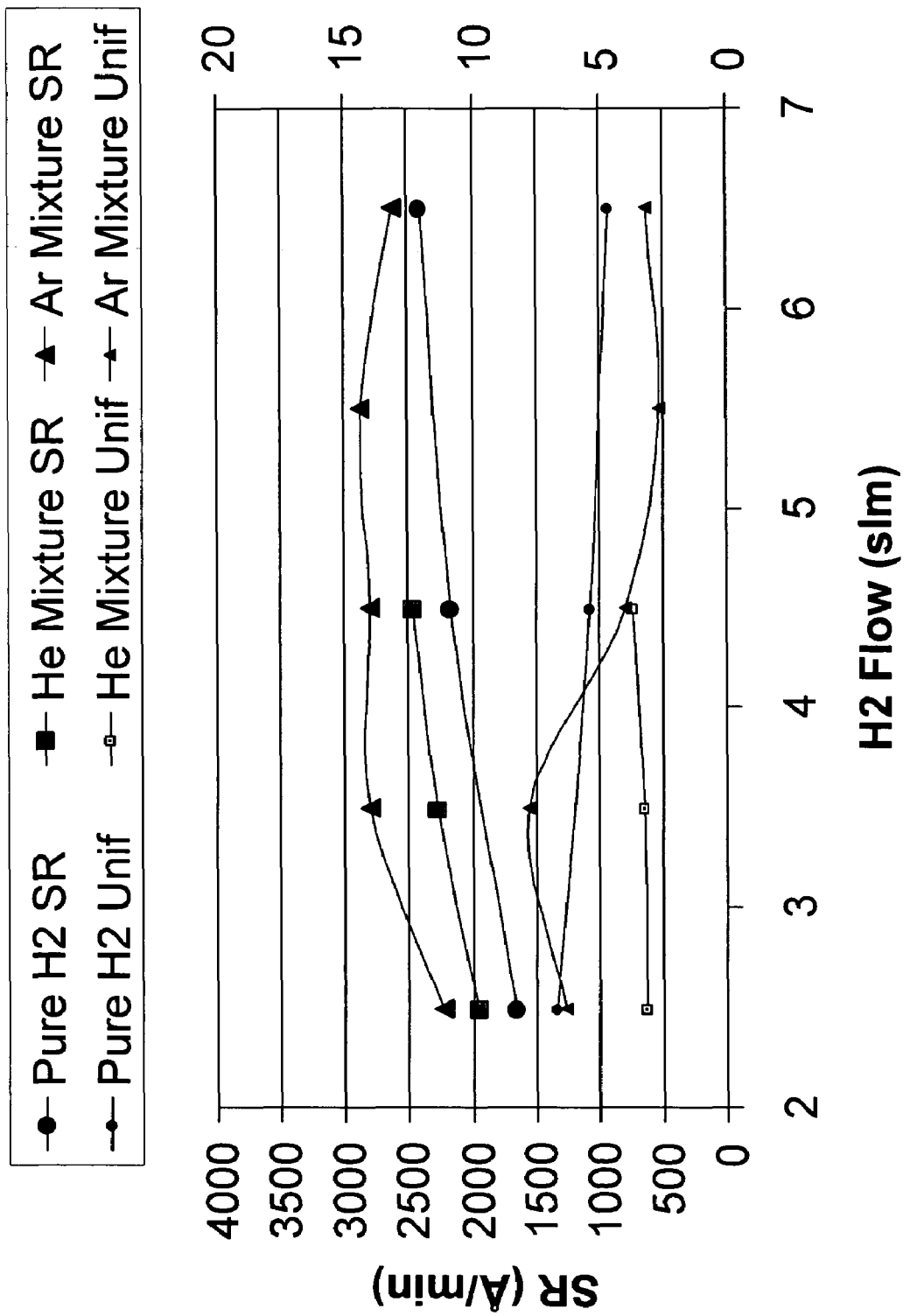
FIG. 2 is a graph showing the effect of downstream mixing with argon or helium flows on dry etch/photoresist strip rate of a wafer and the uniformity of the strip rate over the wafer.

FIG. 2 is graph showing the effects of downstream mixing with argon and helium on the etch/photoresist strip rate of a wafer and the uniformity of the strip rate over the wafer for various hydrogen flows.

Hydrogen flow rate is shown on the x-axis. Net strip rate is shown on the left y-axis in Å/min. Net strip rate does not include any shrinkage due to evaporation of the solvent in the photoresist. Strip rate uniformity over the wafer, calculated as 1 standard deviation/average strip rate, is shown on the right y-axis. FIG. 2 shows strip rate is highest when the hydrogen based plasma is mixed downstream with argon. In particular, mixing 3.5 slm hydrogen/30 sccm carbon dioxide with 3 slm argon resulted in a higher strip rate than achieved with 6.5 slm hydrogen/30 sccm carbon dioxide and no mixing. Thus, downstream mixing results in a strip rate superior to that obtained with a conventional process and a 44% reduction in hydrogen flow.

Strip rates when the hydrogen-based plasma is mixed downstream with helium are also greater than when there is no downstream mixing. Further, strip rate uniformity is shown to be improved for most cases with downstream mixing. Thus, FIG. 2 demonstrates that strip rate and strip rate uniformity are maintained for lower hydrogen flows using methods and apparatus in accordance with the present invention.

Figure 3:
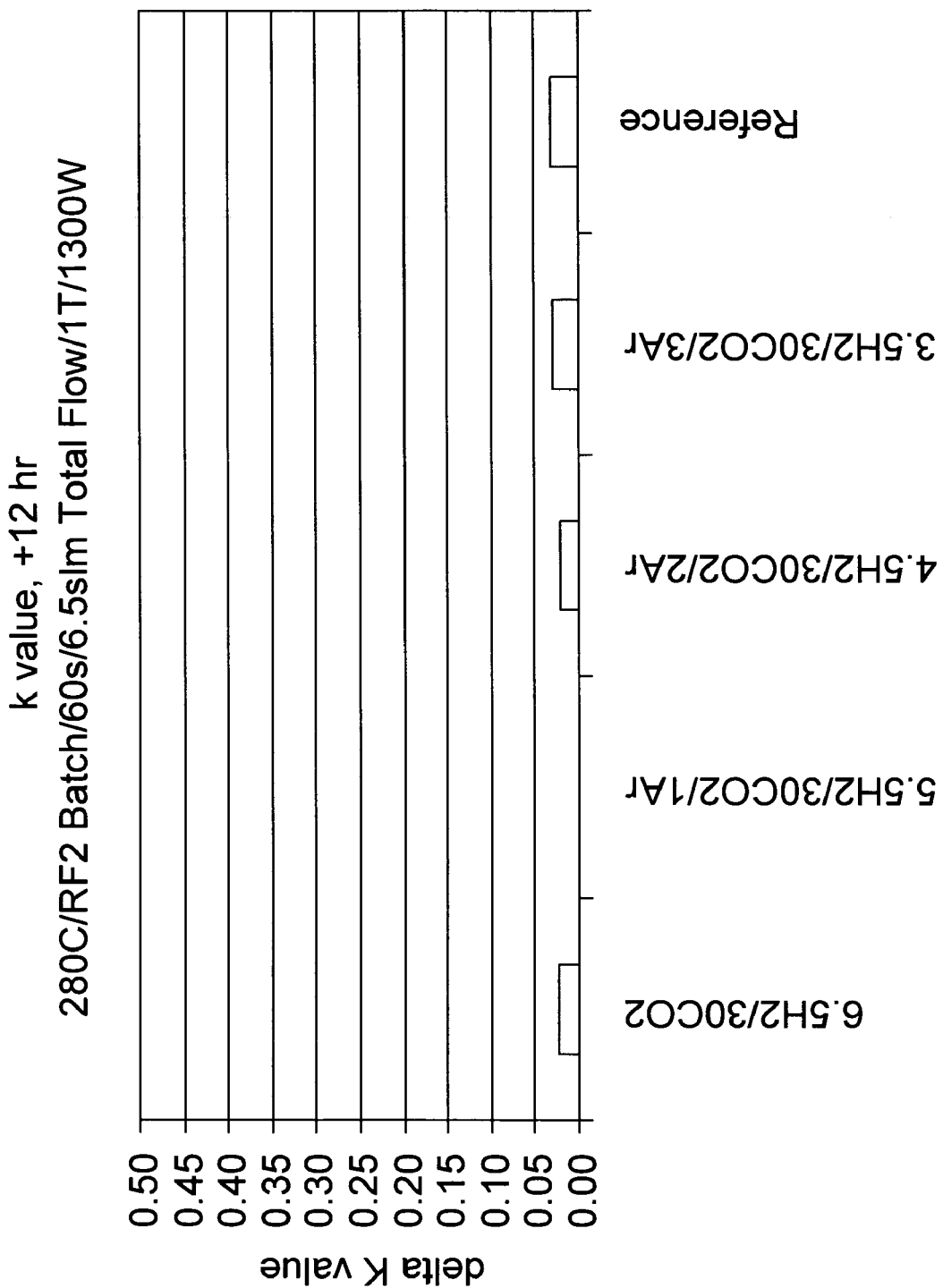
FIG. 3 is a graph showing the effect of downstream mixing with argon on change in k value of a low-k dielectric.

As discussed above, many conventional photoresist/etch strip processes are not effective to strip low-k dielectric materials because they effectively raise the dielectric constant. FIG. 3 is chart showing the effect of various flow rates of argon introduced downstream of a plasma source on change in dielectric constant of a low-k dielectric. A 300 mm wafer with 200 mm Novellus Coral low-k film was stripped at 1 Torr. Flow rate of hydrogen plus inert gas was kept constant at 6.5 slm. 30 sccm of carbon dioxide was introduced with hydrogen to the plasma source. A 1300W RF plasma source was used. The reference value shown is the Δk for a wafer not exposed to plasma and reflects the Δk due to exposure to ambient conditions.

Typically, a Δk of less than 0.1 is acceptable. The reference value in FIG. 3 shows the Δk resulting when the wafer is exposed to air only. FIG. 3 shows that Δk values for downstream mixing with argon are all less than or about the reference value. All are well below maximum acceptable Δk. Thus, FIG. 3 shows that the methods and apparatus of the invention are effective to strip low-k dielectric materials.

Process Parameters

Upstream Inlet Gas

A hydrogen-based gas is introduced to the plasma source. Typically the gas introduced to the plasma source contains the chemically active species that will be ionized in the plasma source to form a plasma. In preferred embodiments, the gas introduced to the plasma source further comprises a weak oxidizing agent such as carbon dioxide, carbon monoxide, nitrogen dioxide, nitrogen oxide and water. In particularly preferred embodiments, the weak oxidizing agent is carbon dioxide. In particularly preferred embodiments, the gas introduced to the plasma source comprises between about 0.1% to about 1.0% carbon dioxide by volume. Applicants disclose methods of stripping photoresist and etch materials from a low-k dielectric using hydrogen-based plasmas with weak oxidizing agents in previously filed U.S. patent application Ser. No. 10/890,653, which is hereby incorporated by reference. The gas introduced to the plasma source may further comprise other gases as needed, for example, to remove any plasma residue from the wafer. In a preferred embodiment, a small amount of nitrogen triflouride is introduced at the last station (in a multi-station process) to remove residue from the wafer.

Plasma Generation

Any known plasma source may be used in accordance with the invention, including a RF, DC, microwave any other known plasma source. In a preferred embodiment, a downstream RF plasma source is used. Typically, the RF plasma power for a 300 mm wafer ranges between about 300 Watts to about 3 Kilowatts. In a preferred embodiment, the RF plasma power is between about 1000 Watts and 1500 Watts.

Inert Gas

Any inert gas may be introduced downstream of the plasma source and upstream of the showerhead for mixing with the plasma. In a preferred embodiment, the inert gas is argon or helium. In a particularly preferred embodiment, the inert gas is argon. However, any inert gas, such as nitrogen, may be used. In preferred embodiments, the inert gas flow rate is between about 0.15 and 10.0 times the hydrogen flow rate. In particularly preferred embodiments, the inert gas flow rate is between about 0.75 and 6.0 times the hydrogen flow rate.

Inert Gas Inlet

The inert gas inlet may be any type of gas inlets and may include multiple ports or jets to maximize mixing with the plasma. The angle of the inlet jets may also optimized to maximize mixing. In a preferred embodiment, there are at least four inert gas inlet jets. In a particularly preferred embodiment, there are sixteen inlet jets. In a preferred embodiment the angle of the inlet jets, as measured from the bottom of the plasma source, is zero degrees so that the inert gas is injected perpendicular to the direction of flow of the plasma entering the showerhead assembly (or the process chamber if there is no showerhead assembly) from the plasma source. An angle of zero degrees also corresponds a direction parallel to the face of the work piece.

Figure 4B:
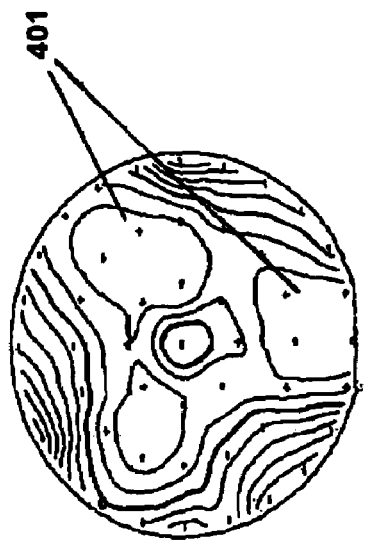
FIGS. 4a–4c are plots representing strip rate topography across the surfaces of 3 wafers treated at different conditions with 3-jet downstream argon gas inlet.
Figure 4C:
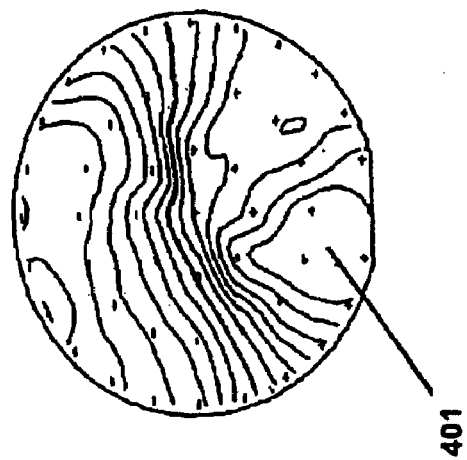
Figure 4A:
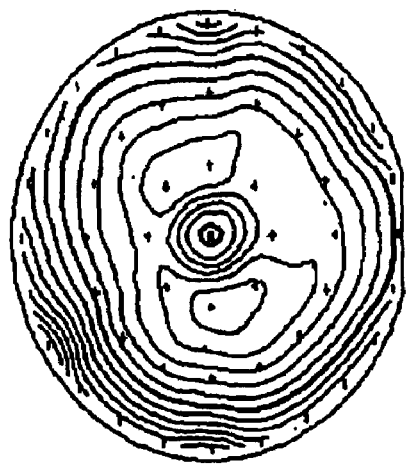

FIGS. 4a–4c are plots representing strip rate topography across the surfaces of 3 wafers treated at different conditions with 3-jet downstream argon gas inlet. FIG. 4a shows the topography of a wafer exposed to a plasma with no downstream mixing. FIG. 4b shows the topography of a wafer exposed to a plasma mixed with 1 slm argon downstream, and FIG. 4c shows topography of a wafer exposed to a plasma mixed with 3 slm argon downstream. Total hydrogen plus argon flow rate was 6.5 slm for all figures. 30 sccm carbon dioxide was also used. Temperature and pressure were kept at 280° C. and 1 Torr and exposure time at 60 seconds.

Areas of higher strip rate 401 can be seen in FIGS. 4a and 4b. This indicates that more than three inert gas inlet jets should be used to achieve better mixing and strip rate uniformity.

Figure 5:
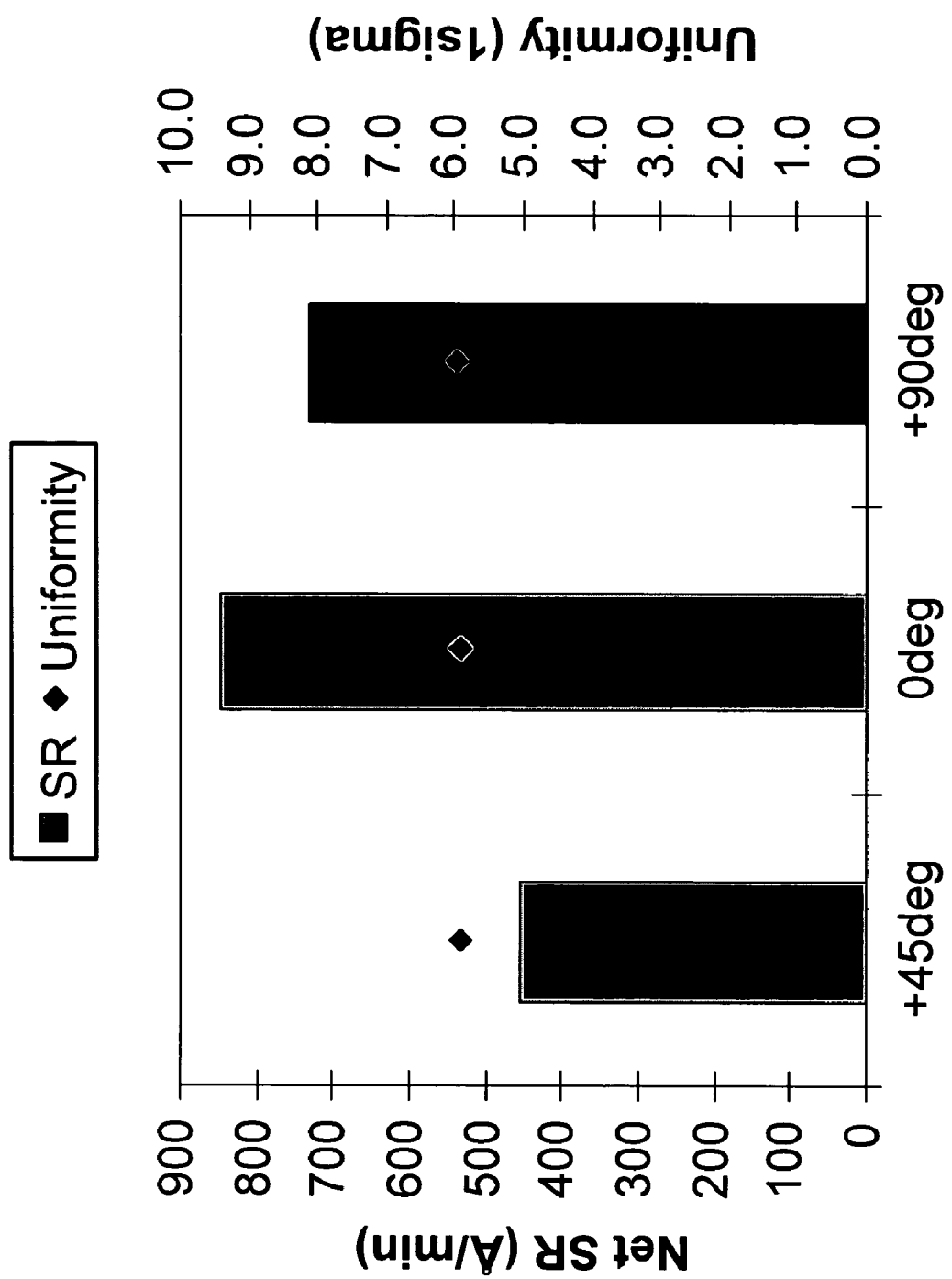
FIG. 5 is a chart showing argon gas inlet jet angle on strip rate and strip rate uniformity of a wafer in a process in accordance with this invention.

FIG. 5 is a chart showing argon gas inlet jet angle on strip rate and strip rate uniformity of a wafer in a process in accordance with this invention. 1.2 μm of a photoresist was deposited on the dielectric. One station was used. 60 seconds of stabilization time to pre-heat the wafer before exposing it to plasma was used followed by 60 seconds of exposure to the plasma. Hydrogen/carbon dioxide flow rates were 3 slm/30 sccm. Downstream argon flow rate was 5 slm.

Net strip rate is shown on the left y-axis in Å/min. Strip rate uniformity over the wafer, calculated as 1 standard deviation/average strip rate, is shown on the right y-axis. Strip rate was maximized when the argon inlet jets were at zero degrees. No difference in strip rate uniformity was detected.

Figure 6A:
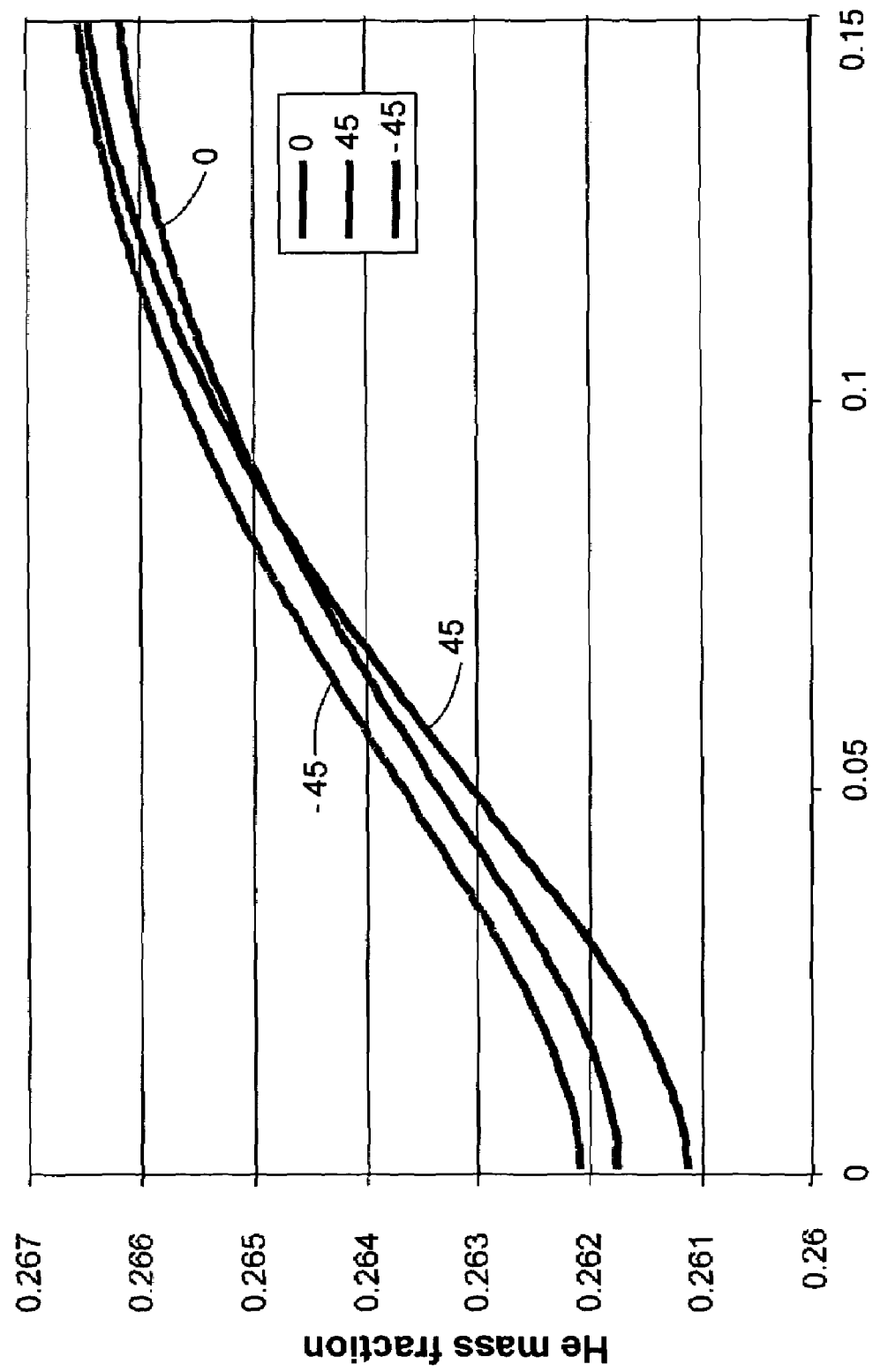
FIGS. 6a and 6b are charts showing the effect of inert gas inlet jet angle on strip rate and strip rate uniformity of a wafer in a process in accordance with this invention.
Figure 6B:
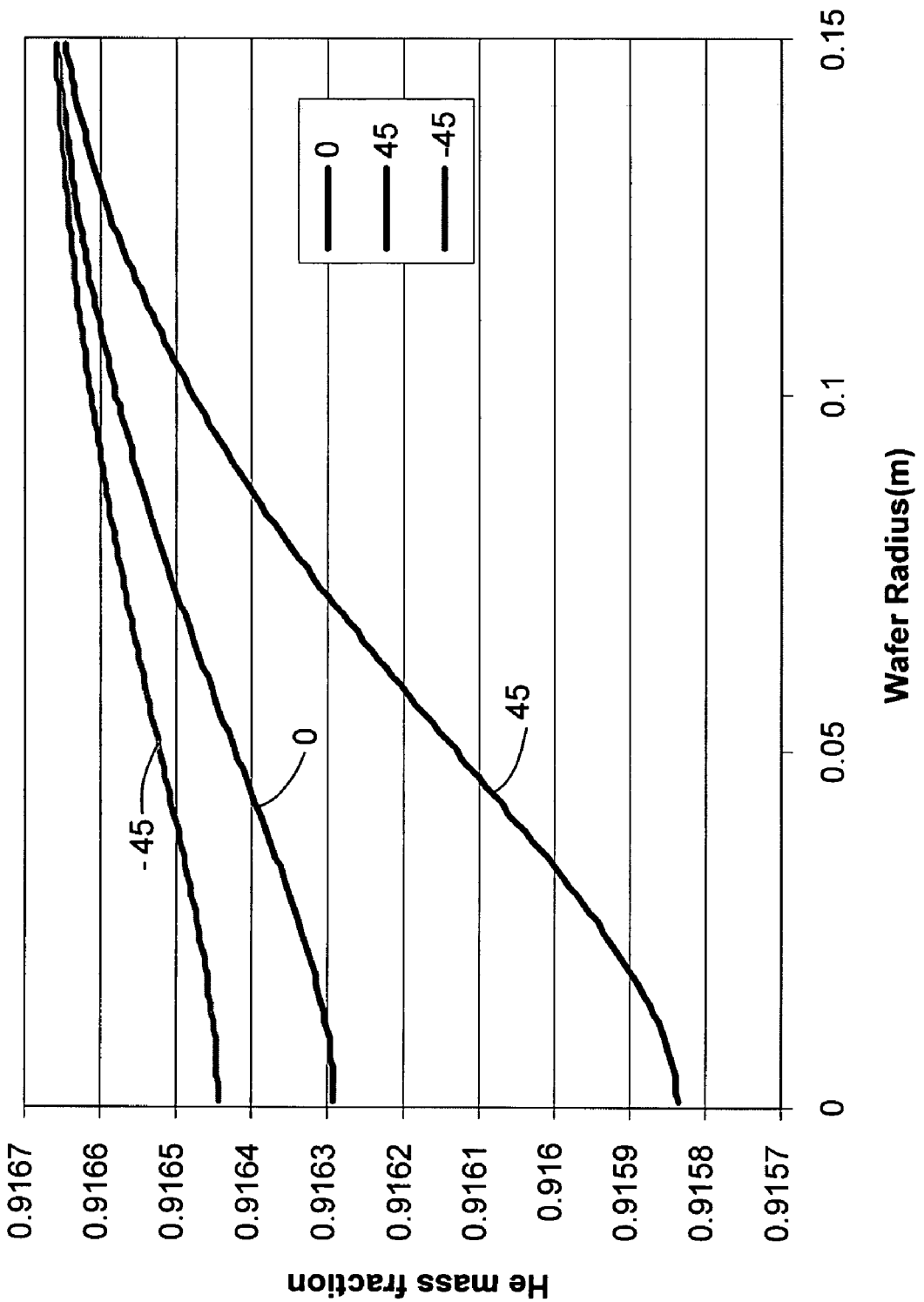

FIGS. 6a and 6b also show that a jet angle of zero degrees maximizes strip rates. FIGS. 6a and 6b show the results of models that predict helium mass fraction as a function of wafer radius for helium injected at −45°, 0° and 45°. Helium mass fraction is proportional to strip rate. Results shown FIG. 6a were found for flow 5.5 slm hydrogen, 1 slm helium and in FIG. 6b for 1 slm hydrogen, 5.5 slm helium. The charts show that for both cases, strip rate is maximizes for an inlet jet angle of zero degrees.

Showerhead Assembly

Preferred embodiments of the present invention include a showerhead assembly. The showerhead assembly may have an applied voltage, terminates the flow of some ions and allows the flow of neutral species into the reaction chamber. The assembly includes the showerhead itself which may be a plate having holes to direct the plasma and inert gas mixture into the reaction chamber. The showerhead redistributes the active hydrogen from the plasma source over a larger area, allowing a smaller plasma source to be used. The number and arrangement of the showerhead holes may be set to optimize strip rate and strip rate uniformity. Fewer holes improve uniformity, but increase recombination of the plasma ions and electrons which results in a lower strip rate. If the plasma source is centrally located over the wafer, the showerhead holes are preferably smaller and fewer in the center of the showerhead in order to push the active gases toward the outer regions. The showerhead preferably has at least 100 holes.

In embodiments in which there is no showerhead assembly, the plasma enters the process chamber directly.

Process Chamber

The process chamber may be any suitable reaction chamber. It may be one chamber of a multi-chambered apparatus or it may simply be a single chamber apparatus.

The chamber may also include multiple stations where different wafers are processed simultaneously. The process chamber may be the same chamber where the etch takes place or a different chamber than where the etch takes place. Process chamber pressure may range from 300 mTorr to 2 Torr. Preferably the pressure ranges from 0.9 Torr to 1.1 Torr.

Work Piece

In preferred embodiments, the work piece used in accordance with the methods and apparatus of the invention is a semiconductor wafer. Any size wafer may be used. Most modern wafer fabrication facilities use either 200 mm or 300 mm wafers. Process conditions may vary depending upon the wafer size. In particularly preferred embodiments, the work piece comprises a single or dual Damascene device.

In some embodiments of the invention, it is desired to keep the work piece at a particular temperature during the application of plasmas to its surface. Preferred wafer temperatures can range between about 220 degrees and about 400 degrees Celsius.

In preferred embodiments, the surface of the work piece comprises low-k dielectric materials, including carbon-doped low-k dielectric materials such as carbon-doped oxides (CDOs). Non-porous and porous dielectric materials, including CDOs and other compositions may be used.

EXAMPLES 300 mm sized wafers were processed (i.e., photoresist stripped) on a strip station. Each wafer was covered with 1.2 μm of photoresist. RF power was set at 1300W and pressure at 1 Torr. 30 sccm of carbon dioxide was introduced into the plasma source with the hydrogen. Flow rate of hydrogen plus inert gas was kept at 6.5 slm. The results are shown in FIG. 2 as described above.

Figure 7:
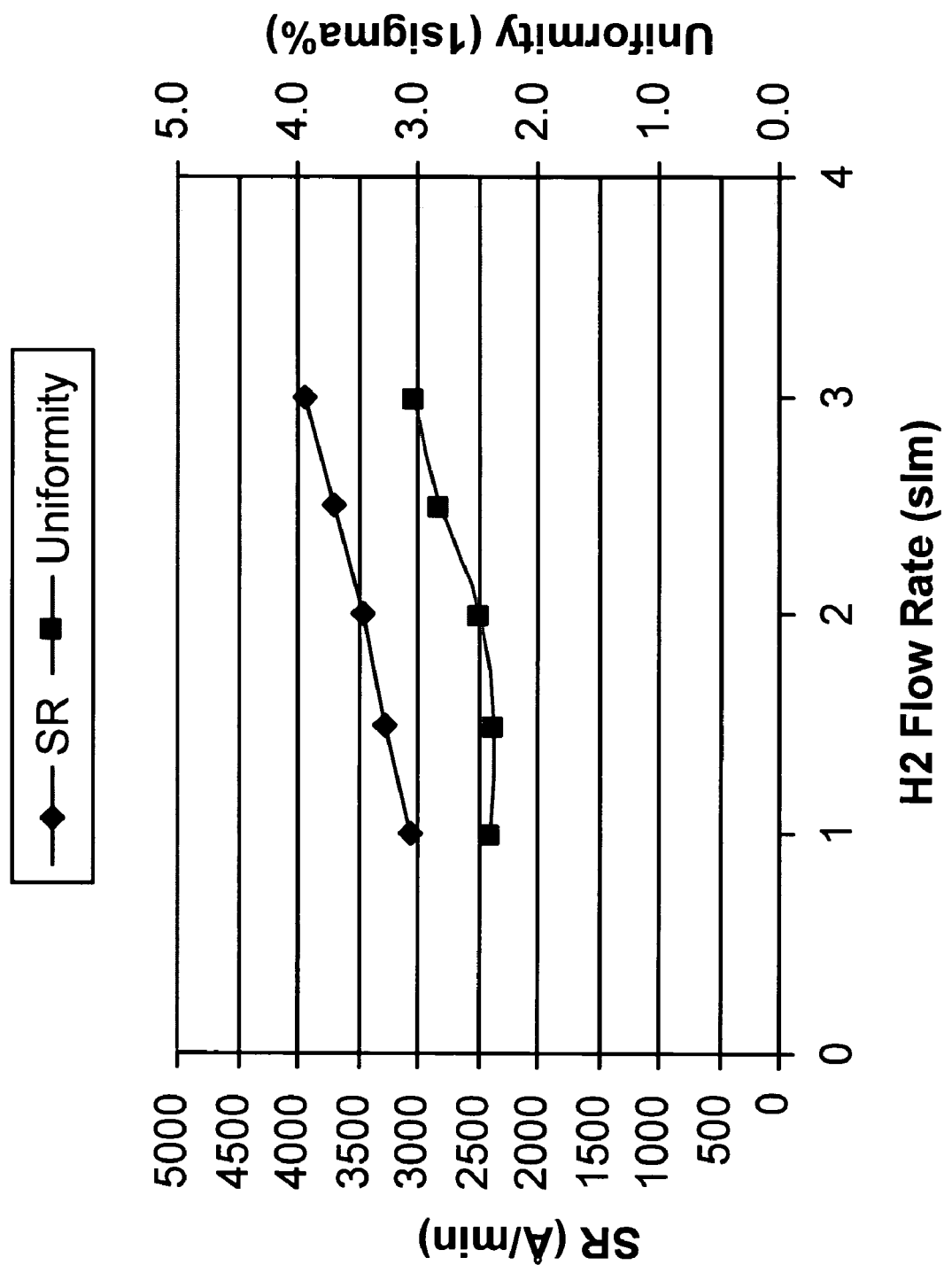
FIG. 7 is a graph showing the effect of hydrogen flow rate on dry etch/photoresist strip rate of a wafer and strip rate uniformity over the wafer.

300 mm sized wafers were processed. Each wafer was covered with 1.2 μm of photoresist. RF power was set at 1500W and pressure at 1 Torr. Argon flow rate was kept at 6 slm. Net strip rate and strip rate uniformity was found for argon/hydrogen rations of hydrogen flow rates of 1 slm, 1.5 slm, 2.0 slm, 2.5 slm and 3.0 slm (i.e. for argon/hydrogen ratios of 6.0, 4.0, 3.0, 2.4 and 2.0). Results are shown in FIG. 7. All examples resulted in net strip rates greater than 3000 Å/min and strip rate uniformities of less than 4%.

Seven 300 mm wafers were processed on a five-station chamber with RF power set at 1300 W and pressure at 1.1 Torr. Total hydrogen flow rate was kept at 15 slm and total carbon dioxide flow rate was kept at 150 sccm. Total argon flow rate was kept at 30 slm. The average net strip rate of the seven wafers was 2951 Å/min. Strip rate uniformity was calculated for six of the wafers with the average found to be 3.61%.

Seven 300 mm wafers were processed with RF power set at 1200 W and pressure at 0.9 Torr. Total hydrogen flow rate was kept at 12 slm and total carbon dioxide flow rate was kept at 150 sccm. Total argon flow rate was kept at 24 slm. The average net strip rate of the seven wafers was 2807 Å/min. Strip rate uniformity was calculated for six of the wafers with the average found to be 3.00%.

Additional experimental results are shown in Table 1 which shows strip rates and strip rate uniformity obtained for various argon flow rates, pressures, and RF powers. All data was collected using in a five-station chamber with hydrogen flow of 3 slm per station (15 slm total) and carbon dioxide flow of 30 sccm per station (150 sccm total).

TABLE 1

Experimental results of downstream mixing with argon

| Downstream argon flow rate per station (slm) | RF power (W) | Pressure (Torr) | Net strip Rate (Å/min) | Strip rate uniformity (%) |
|---|---|---|---|---|
| 4 | 1300 | 1.0 | 2921 | 4.4 |
| 4 | 1300 | 1.1 | 2707 | 3.3 |
| 4 | 1500 | 1.0 | 2669 | 4.6 |
| 4 | 1500 | 1.1 | 2943 | 4.3 |
| 6 | 1300 | 1.0 | 3298 | 3.5 |
| 6 | 1300 | 1.1 | 2718 | 3.0 |
| 6 | 1500 | 1.0 | 3046 | 3.3 |
| 6 | 1500 | 1.1 | 2953 | 3.6 |

The target strip rate for the examples shown in Table 1 was 2200 Å/min with a uniformity of less than 4%. All of the above examples meet the target strip rate and most meet the target uniformity.

Note that experimental results for these specific examples are shown to clarify and illustrate the effectiveness of methods of the invention and are not meant to limit the invention to any particular embodiments.

What is claimed is:

1. A method of removing material from a work piece surface in a reaction chamber comprising:
   (a) introducing a gas comprising hydrogen into a plasma source;
   (b) generating a plasma from the gas introduced into the plasma source;
   (c) introducing an inert gas downstream of the plasma source and upstream of the work piece; and
   (d) removing the material from the work piece.

2. The method of claim 1, wherein introducing the inert gas comprises introducing the gas upstream of a showerhead.

3. The method of claim 1, wherein the inert gas comprises argon.

4. The method of claim 1, wherein the inert gas comprises helium.

5. The method of claim 1, wherein the work piece surface comprises a dielectric layer on a partially fabricated integrated circuit.

6. The method of claim 5, wherein the material being removed from the dielectric layer comprises photoresist and/or residues from an etch process.

7. The method of claim 5, wherein the dielectric layer is a low-k dielectric material.

8. The method of claim 7, wherein the low-k dielectric material is a carbon-doped oxide.

9. The method of claim 1, wherein the work piece is a Damascene device.

10. The method of claim 1, wherein the work piece is a 300 mm semiconductor wafer.

11. The method of claim 1, wherein the flow rate of the inert gas is between 0.15 and 10 times the hydrogen gas flow rate.

12. The method of claim 11, wherein the flow rate of the inert gas is between 0.75 and 6 times the hydrogen gas flow rate.

13. The method of claim 1, wherein the gas introduced into the plasma source further comprises a weak oxidizing agent.

14. The method of claim 13, wherein the weak oxidizing agent is carbon dioxide.

15. The method of claim 14, wherein the gas introduced into the plasma source comprises between about 0.1% to about 1.0% carbon dioxide by volume.

16. The method of claim 1, wherein the plasma source is a RF plasma source.

17. The method of claim 16, wherein the work piece is a 300 mm wafer and the RF power ranges between about 300 Watts and about 3 Kilowatts.

18. The method of claim 17, wherein the work piece is a 300 mm wafer and the RF power ranges between about 1000 Watts and about 1500 Watts.

19. The method of claim 1, wherein the temperature of the work piece ranges between about 220 degrees and about 400 degrees Celsius.

20. The method of claim 1, wherein the pressure in the process chamber ranges between about 300 mTorr and about 2 Torr.

21. The method of claim 20, wherein the pressure in the process chamber ranges between about 0.9 Torr and about 1.1 Torr.

* * * * *